(12) United States Patent
Freeman

(10) Patent No.: US 8,699,535 B1
(45) Date of Patent: Apr. 15, 2014

(54) TERAHERTZ STEP WELL QUANTUM CASCADE STRUCTURES

(71) Applicant: The United States of America as Represented by the Secretary of the Navy, Washington, DC (US)

(72) Inventor: Will Freeman, Ridgecrest, CA (US)

(73) Assignee: The United States of America as Represented by the Secretary of the Navy, Washington, DC (US)

(*) Notice: Subject to any disclaimer, the term of this patent is extended or adjusted under 35 U.S.C. 154(b) by 0 days.

(21) Appl. No.: 13/682,457

(22) Filed: Nov. 20, 2012

Related U.S. Application Data

(63) Continuation of application No. 13/605,021, filed on Sep. 6, 2012, now abandoned.

(60) Provisional application No. 61/532,683, filed on Sep. 9, 2011.

(51) Int. Cl.
*H01S 5/00* (2006.01)

(52) U.S. Cl.
USPC .................. 372/45.01; 372/46.01

(58) Field of Classification Search
USPC .......................... 372/45.01, 46.01
See application file for complete search history.

(56) References Cited

U.S. PATENT DOCUMENTS 8,098,702 B1   1/2012   Freeman

OTHER PUBLICATIONS

Will Freeman and Gamani Karunasiri, Propused Use of Step Quantum Wells for Terahertz Quantum Cascade Lasers, ITQW presentation material presented Sep. 14, 2007.
Will Freeman and Gamani Karunasiri, Monte Carlo simuation of terahertz step well quantum cascade laser structures, Proc. SPIE 7311, 73110V (2009).
Will Freeman, Modeling electron transport coherence in one and two-well terahertz step well quantum cascade structures . . . , Proc SPIE vol. 8023, Abstract published Oct. 2010.
Will Freeman, Terahertz Quantum Cascade Structures Using Step Wells and Longitudinal Optical-Phonon Scattering, Naval Postgraduate School disertation, Jun. 2009.
Will Freeman and Gamani Karuansiri, Intersubband Electron-Electron and Electron-Phonon Scattering in Terahertz Step Quantum Wells for Quantum . . . , NAWCWD TM 8577, May 2008.

*Primary Examiner* — Armando Rodriguez
(74) *Attorney, Agent, or Firm* — Christopher L. Blackburn

(57) ABSTRACT

Terahertz quantum cascade structures employing multiple steps per periodic section. Terahertz quantum cascade structures employing no more than one step per periodic section.

16 Claims, 6 Drawing Sheets

TERAHERTZ STEP WELL QUANTUM CASCADE STRUCTURES

CROSS REFERENCE TO RELATED APPLICATION

This application claims priority to the prior filed U.S. provisional patent application having Ser. No. 61/532,683 filed on Sep. 9, 2011.

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefore.

FIELD OF THE INVENTION

The invention relates to step well quantum cascade (QC) structures for use in quantum cascade lasers (QCLs).

Figure 1:
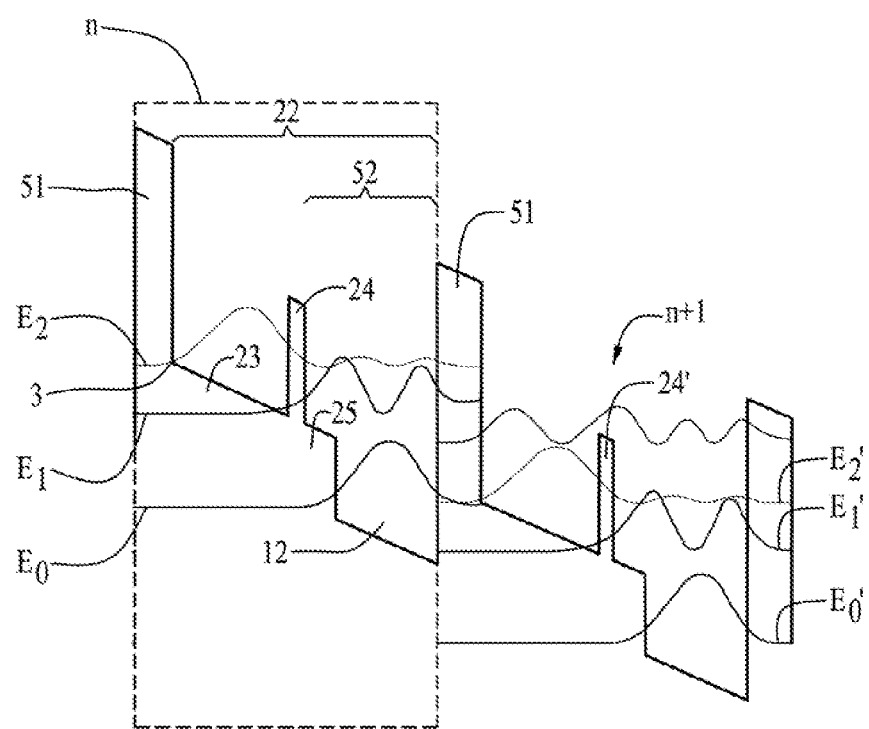
FIG. 1 illustrates the conduction band diagram of an embodiment (shown under an applied electric field) utilizing multiple steps. In this illustrated embodiment, the multiple steps improve control of the degree of spatial overlap of the wavefuctions for the radiative lasing transition, resulting in a more diagonal transition. Each energy state is characterized by a wavefunction whose modulus squared is indicative of the probability distribution of the electrons residing in that state.

It is to be understood that the foregoing and the following description are exemplary and explanatory only and are not to be viewed as being restrictive of the invention, as claimed.

DESCRIPTION

Before beginning with the description of some of the embodiments, it is noted that, for illustrative purposes, a Type I bandgap alignment (where the barrier heights in the conduction band are controlled by the material bandgap) is assumed in this specification, including the claims, and drawings.

The conduction band profile can be found by solving Schrödinger's equation or by using a self consistent solution to Schrödinger's and Poisson's equations.

A Quantum Cascade (QC) structure constructed in accordance with the principles of the invention includes an active lasing region generally formed as a semiconductor heterostructure having a plurality of cascaded nominally identical periodic sections, which are functionally associated in series. The number of the periodic sections is typically on up to about 200 sections.

In some embodiments, the heterostructure of at least one periodic section of an embodiment of a terahertz QC structure includes at least one quantum well, where at least one of the at least one quantum wells is a step well capable of forming at least three states (upper, middle, and lower). The heterostructure of some embodiments of a terahertz QC structure has only one quantum well per periodic section when that one quantum well is a step well. Note that in some embodiments employing a step well injector, such as for example in FIG. 3, it is possible that less than three states are formed within a step well.

An exemplary embodiment of a step well in a QC structure is formed as an $Al_xGa_{1-x}As$ heterostructure, where at least two Al compositions are used. However, in other embodiments, a step well in a QC structure is formed using more than two Al compositions, as shown in the embodiments of FIGS. 1, 2, 4, 6 and 7. An $Al_xGa_{1-x}As$ heterostructure is an exemplary material that may be used to grow the step well(s) in a QC structure. The step well(s) in a QC structure may also be grown using suitable semiconductor materials known to one skilled in the art other than $Al_xGa_{1-x}As$. The periodic sections are doped using any known method.

The active region may be formed into a waveguide by any known means. Two commonly used waveguide approaches are the metal-metal and surface-plasmon waveguides. One of the facets of the waveguide and resonator can be coated with a high reflectivity coating or left uncoated. The laser is formed by growing N sections and processing the sample into a waveguide/resonator. Typically, the active region thickness is on the order of about 10 μm and guide widths are on the order of about 20 to about 200 μm, depending on the type of waveguide used.

Although the figures illustrate no more than two periodic sections, those having ordinary skill in the art will appreciate that the exemplary illustrations are applicable to the other periodic sections in the active region. Further, though certain conduction band heights and energy states (or levels) are illustrated, the illustrated conduction band heights and energy levels were selected for exemplary purposes, and those having ordinary skill in the art will appreciate that the conduction band heights and energy levels of a step quantum well QC structure can vary in accordance with the principles of the invention.

One and two well LO-phonon step QC structures are described, in which step injectors are formed using more than one conduction band height, and the wavefunction overlap of the radiative lasing transition can be controlled. The LO-phonon transition can take place from a single energy state via an intrawell transition, and as such is capable of maintaining a depopulated lower lasing state relatively independent of the applied electric field bias. Isolation of the upper lasing state and lower (ground) state can be controlled/maintained. In addition, a tapered QC structure is described in which the conduction band profile is smoothly tapered as a function of the growth direction and there may be no abruptly defining interfaces, as is the case for conventional square and also step QC structures.

The term "quantum well" is known in the art. As used herein, consistently with the usage in the art, a "quantum well", formed in the conduction band of a semiconductor construct, refers to a planar semiconductor region sandwiched between two planar semiconductor regions (typically referred to as barrier layers) having a different bandgap, where the bandgap of the sandwiched region is smaller than the bandgaps of the barrier layers (for square wells the barrier layers usually have the same bandgap). The spacing between the barrier layers, and consequently the thickness of the quantum well layer is selected such that charge carriers siding in the quantum well layer exhibit quantum effects.

The term "step quantum well" (referred to in this specification including the claims as "step well"), formed in the conduction band of a semiconductor construct, as used herein, describes a planar semiconductor region, having at least two semiconductor layers sandwiched between two planar semiconductor regions (which are referred to herein as "barrier layers") in a periodic section, where; 1) each of the at least two semiconductor layers comprising the sandwiched semiconductor region having a bandgap that is different than the bandgap of at least one of the other at least two semiconductor layers in the sandwiched semiconductor region; and 2) each of the at least two semiconductor layers comprising the sandwiched region having a bandgap that is smaller than the bandgap of the barrier layers. Any sandwiched semiconductor layer having a bandgap greater than the bandgap of the sandwiched semiconductor layer having the smallest bandgap is referred to herein, including the claims, as a "step".

Each of the semiconductor layer(s), of the sandwiched semiconductor region, having the smallest bandgap is referred to herein, including the claims, as a "trough layer". "Barrier layers", as used herein, are either injection barrier layers or collector barrier layers.

In the illustrated embodiments, injection barriers are formed of layers having different conduction band heights (where the multi-height injection barriers are referred to as step injectors). The term "injection barrier layer", as used herein, is the highest conduction band layer of an injection barrier. The term "collector barrier" is any layer in the active region of a lasing section that is not an injection barrier layer and has a conduction band height equal to or greater than the conduction band height of the injection barrier layer of the next periodic section.

An embodiment illustrated in FIG. 1 is described to illustrate the meaning of step wells, steps, troughs, and barriers ("injector barrier layers" and "collector barrier layers").

With reference to FIG. 1, the injection barrier of first periodic section n is formed of layers having different conduction band heights, e.g., 51 and 23. The injection barrier layer for each periodic section is labeled 51; 51 is the injection barrier layer as defined herein because it has a higher bandgap than any other layer of the injection barrier of which it is a part. Reference number 22 designates a step well; 22 is a step well as defined herein because, as defined above, it is a planar semiconductor region 22, having at least two semiconductor layers 12, 23, 24, 25 sandwiched between two planar semiconductor regions (which are referred to herein as "barrier layers"), where: 1) each of the at least semiconductor layers comprising the sandwiched semiconductor region have a bandgap that is different than the bandgap of at least one of the other at least two semiconductor layers 12, 23, 24, 25 in the sandwiched semiconductor region 22; and 2) each of the at least two semiconductor layers 12, 23, 24, comprising the sandwiched region 22 have a bandgap that is smaller than the bandgap of the barrier layers 51 (in this exemplary embodiment, the only barrier layers illustrated are the injector barrier layers). Reference number 12 designates a trough layer, because, as defined above, it is the semiconductor layer, within a sandwiched semiconductor region 22, having the smallest bandgap. In FIG. 1, the steps in the first periodic n section are designated as 23, 24, and 25.

In some embodiments, both the THz radiative lasing transition and LO-phonon transition (used for depopulation of the lower lasing state) are vertical intrawell transitions. Depopulation of the lower lasing state via an intrawell LO-phonon transition is approximately independent of the applied electric field bias (as is the case for all designs except that described in FIG. 5).

For ease of semiconductor growth (in MBE systems with only two Al guns), structures with three conduction band heights (as in FIG. 4) may be designed such that the Al composition of the injection barrier layer 51 is a sum of the other two conduction band height 43, 44 Al compositions, i.e., x=0.03, 0.12, and 0.15 in a $Al_xGa_{1-x}As$ material system could be used.

Figure 2:
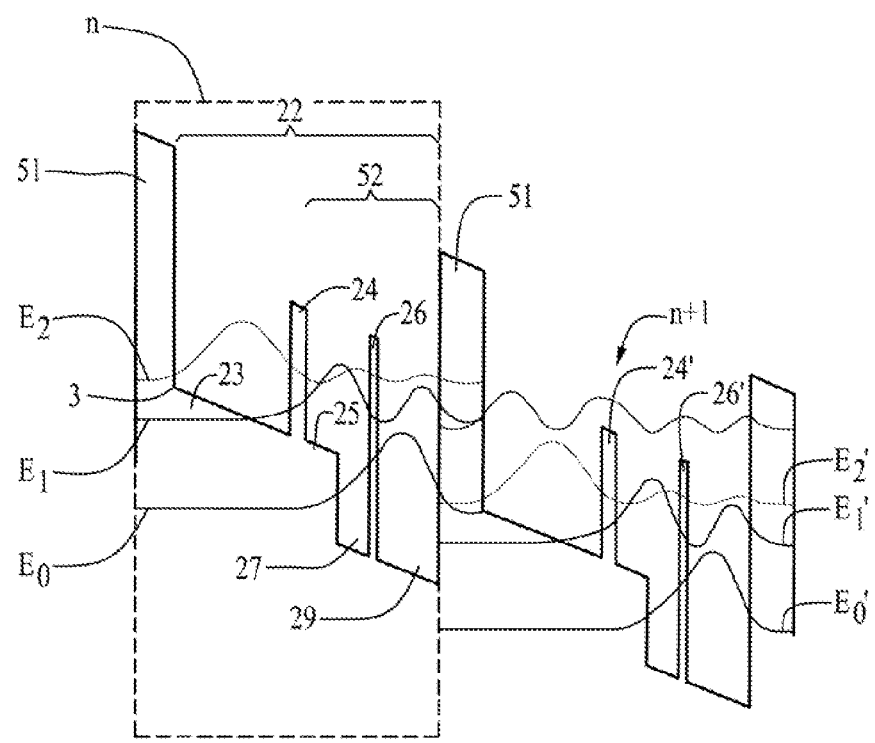
FIG. 2 illustrates the conduction band diagram of an embodiment (shown under an applied electric field) utilizing multiple height steps. This figure illustrates using an additional step 26 (versus FIG. 1 embodiments) to control (in this case reduce) the degree of spatial overlap of the wavefunctions of a periodic section's upper lasing state and lower state (ground state). Note this illustrates that both the radiative lasing transition and longitudinal optical-phonon ("LO-phonon") transition are to some degree diagonal transitions as designed/controlled in some embodiments. Each energy state is characterized by a wavefunction whose modulus squared is indicative of the probability distribution of the electrons residing in that state.
Figure 4:
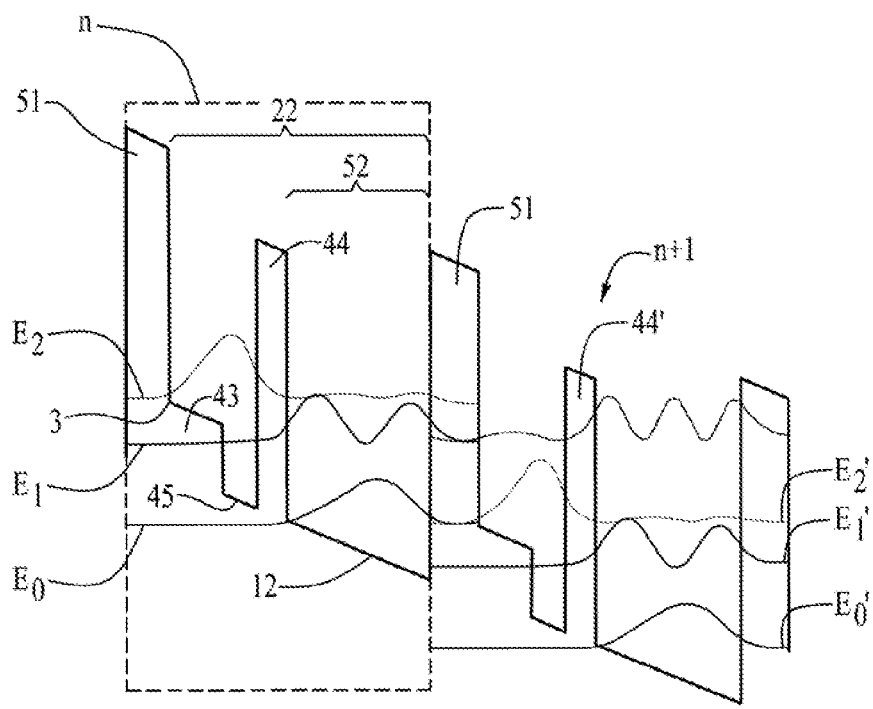
FIG. 4 illustrates the conduction band diagram of an embodiment (showy under an applied electric field) of a single well QC structure that is comprised of a step injector and includes a collector barrier. The un-labeled state illustrates a principally unused state; however, at the anticrossing bias with the lower lasing state it would serve to help depopulate the lower lasing state. Each energy state is characterized by a wavefunction whose modulus squared is indicative of the probability distribution of the electrons residing in that state.

FIGS. 1, 2, and 4, illustrate some embodiments of a semiconductor heterostructure constructed in accordance with principles of the invention having a plurality of periodic sections n, n+1 functionally associated in series. In the embodiments illustrated in FIGS. 1, 2 and 4, the plurality of periodic sections n, n+1 includes a first periodic section n and a second periodic section n+1, with the first periodic section n and the second periodic section n+1 being adjacent. Each of the first periodic section n and the second periodic section n+1 has at feast one quantum well 22. At least one of the at least one quantum well 22 of the first periodic section is a step well 22 having a plurality of steps.

In FIG. 1, the steps in the first periodic n section are designated as 23, 24, and 25. In FIG. 2, the steps in the first periodic section n are designated as 23, 24, 25, and 26. In FIG. 4, the steps in the first periodic section n are designated as 43 and 44.

In FIGS. 1, 2, and 4, a lower (ground) state, a 'middle state' or 'lower lasing state', and an 'upper lasing state' are formed in each periodic section n, n+1 in the presence of an applied electric field. First periodic section's n lower state, lower lasing state, and upper lasing state, are designated as E0, E1, and E2, respectively. Second periodic section's n+1 lower state, lower lasing state, and upper lasing state, are designated as E0', E1', and E2', respectively. The energy spacing between each periodic section's upper lasing state and lower lasing state (which are spaced at the radiative energy spacing) is smaller than the energy spacing between the periodic section's lower lasing state and lower state (which are spaced at or near the resonant LO-phonon energy spacing). Electrons populating a periodic section's lower lasing state undergo non-radiative transition via resonant emission of a LO-phonon into the periodic section's lower state; the resonant LO-phonon emission selectively depopulates the periodic section's lower lasing state such that the lifetime of the periodic section's upper lasing state is greater than the lifetime of the periodic section's lower lasing state. In some of these embodiments, each periodic section's upper lasing state and lower lasing state are separated by an energy corresponding to an optical frequency in a range from about 1 terahertz to about 5 terahertz.

Note that, as illustrated in FIGS. 1, 2, and 4, in some embodiments of the invention described with reference to FIGS. 1, 2, and 4, each periodic section n, n+1 contains no more than a single quantum well 22 when that well is a step well; note however, that other embodiments of quantum well structures consistent with the principles described with reference to FIGS. 1, 2, and 4 include multiple quantum wells per periodic section n, n+1.

FIGS. 1 and 2 illustrate some embodiments in which the first step well's 22 first step 23 has a lower conduction band height than the second step 24. Step 24 affects the amount of overlap of the wavefunctions of E2 and E1; more particularly, in the embodiments illustrated in FIGS. 1 and 2, step 24 is adapted to create a diagonal E2 to E1 transition, which reduces E2 to E0 scattering and, as temperature increases, improves temperature performance. Note also that second periodic section n+1 step 24' spatially separates overlap of E2' and E1', which increases injection efficiency from first periodic section n lower lasing state E0 into second periodic section n+1 upper lasing state E2' by increasing spatial separation of wavefunctions of E0 and E1'. Note that the principal injection efficiency improving contribution is provided by step 23, which works to reduce spatial overlap of the wavefunctions of E0 and E1'.

In these embodiments, the second periodic section n+1 has a second periodic section upper lasing state E2', a second periodic section lower lasing state E1', and a second periodic section lower state E0'.

Step well 22 has, in the presence of an applied electric field, a first periodic section upper lasing state E2, a first periodic section lower lasing state E1, and a first periodic section lower state E0, wherein the upper lasing state E2 is located near or above the highest point of a first of the plurality of steps 23 and the lower lasing state E1 is located below the upper lasing state E2 and below the highest point of the first of the plurality of steps 23 such that spatial separation is such that the overlap of the wavefunctions of the second periodic section n+1 upper lasing state E2' and the first periodic section n lower state E0 is greater than the overlap between the way functions of the second periodic section n+1 lower lasing state E1' and the first periodic section n lower state E0.

FIG. 4 illustrates embodiments in which the first step well's 22 first step 43 has a lower conduction band height than the second step 44. Step 44 affects the amount of overlap of the wavefuctions of E2 and E1; more particularly, in the embodiments illustrated in FIG. 4, step 44 is adapted to create a diagonal E2 to E1 transition, which reduces E2 to E0 scattering and, as temperature increases, improves temperature performance. Note also that second periodic section n+1 step 44' spatially separates overlap of E2' and E1', which increases injection efficiency from first periodic section n lower lasing state E0 into second periodic section n+1 upper lasing state E2' by increasing spatial separation of wavefunctions of E0 and E1'. Note that the principal injection efficiency improving contribution is provided by step 43, which works to reduce spatial overlap of the wavefunctions of E0 and E1'.

In these embodiments, the second periodic section n+1 has a second periodic section upper lasing state E2', a second periodic section lower lasing state E1', and a second periodic section lower state E0'.

Step well 22 has, in the presence of an applied electric field, a first periodic section upper lasing state E2, a first periodic section lower lasing state E1, and a first periodic section lower state E0, wherein the upper lasing state E2 is located near or above the highest point of a first of the plurality of steps 43 and the lower lasing state E1 is located below the upper lasing state E2 and below the highest point of the first of the plurality of steps 43 such that a spatial separation is such that the overlap of the wavefunctions of the second periodic section n+1 upper acing state E2' and the first periodic section n lower state E0 is greater than the overlap between the wavefunctions of the second periodic section n+1 lower lasing state E1' and the first periodic section n lower state E0. Trough layer 45 separates the second step 44 from the first step 43.

In FIGS. 1, 2, and 4, a radiative lasing transition between the first periodic section n upper lasing state E2 and the first periodic section n lower lasing state E1 occurs within the step well 22 and the radiative lasing transition is a photon-assisted tunneling transition through one of the plurality of steps 24, 44 (in the embodiments illustrated in FIGS. 1, 2, and 4, the second and highest of the plurality of steps).

In some of the embodiments, as exemplarily illustrated in FIGS. 1 and 4, a LO-phonon transition occurs primarily in well space 52. The lower lasing state is depopulated via fast intrawell electron LO-phonon scattering.

In other embodiments, as exemplarily illustrated in FIG. 2, the LO-phonon transition occurs primarily in well space 52 (within troughs 27 and 29 and step 26) and uses step 26 to reduce the spatial overlap of the wavefunctions of E2 to E0. Step 26 is adapted to reduce E2 to E0 scattering by reducing the spatial overlap of the wavefunctions of E2 and E0; note that the wavefunction of E0 in FIG. 2 is shifted slightly to the right within periodic section n relative to the wavefunction of E0 in FIG. 1, and the wavefunction of E2 in FIG. 2 is shifted slightly to the left within periodic section n relative to the wavefunction of E2 in FIG. 1. In some of these embodiments, the number of the plurality of steps is at least three.

Figure 3:
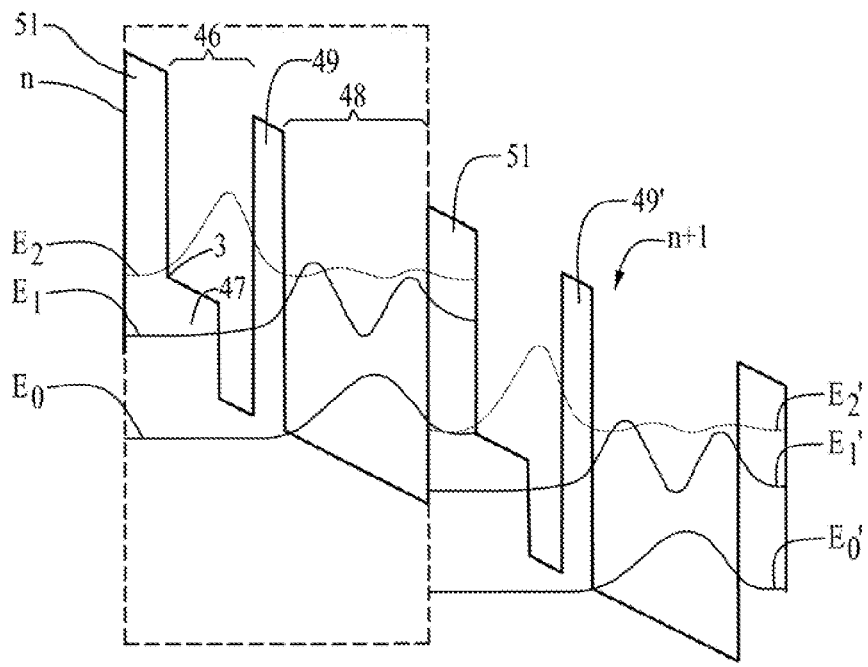
FIG. 3 illustrates the conduction band diagram of an embodiment (shown under an applied electric field) of a two well QC structure including a step injector. The radiative lasing transition is diagonal or sideways and the LO-phonon transition is an intrawell vertical transition for fast/rapid depopulation of the lower lasing state. Illustration of this embodiment illustrates a unique feature of some embodiments of the invention, in that some of the embodiments do not have any principally unused states, ie., all the states are used. The structure in FIG. 3 includes no more than three states. Each energy state is characterized by a wavefunction whose modulus squared is indicative of the probability distribution of the electrons residing in that state.

With reference to FIG. 3, some embodiments include a semiconductor heterostructure having a plurality of periodic sections n, n+1 functionally associated in series. The plurality of periodic sections n, n+1 includes a first periodic section n and a second periodic section n+1, with the first periodic section n and second periodic section n+1 being adjacent.

Each of the first periodic section n and the second periodic section n+1 have a plurality of quantum wells 45, 48, with at least one of the plurality of quantum wells 46, 48 being a step well 46.

A lower (ground) state, a 'middle state' or 'lower lasing state', and an 'upper lasing state' are formed in each periodic section n, n+1 in the presence of an applied electric field. First periodic section's n lower state, lower lasing state, and upper lasing state, are designated as E0, E1, and E2, respectively. Second periodic section's n+1 lower state, lower lasing state, and upper lasing state, are designated as E0', E1', and E2', respectively. The energy spacing between each periodic section's upper lasing state and lower lasing state (which are spaced at the radiative energy spacing) is smaller than the energy spacing between the periodic section's lower lasing state and lower state (which are spaced at or near the resonant LO-phonon energy spacing). Electrons populating a periodic section's lower lasing state undergo non-radiative transition via resonant emission of a LO-phonon into the periodic section's lower state; the resonant LO-phonon emission selectively depopulates the periodic section's lower lasing state such that the lifetime of the periodic section's upper lasing state is greater than the lifetime of the periodic section's lower lasing state. In some of these embodiments, each periodic section's upper lasing state and lower lasing state are separated by an energy corresponding to an optical frequency in a range from about 1 terahertz to about 5 terahertz.

A first of the plurality of quantum wells 46 of the first periodic section n is a step well that has at least one step 47. Step well 46 has, in the presence of an applied electric field, a a first periodic section n upper lasing state E2 and a first periodic section n lower lasing state E1, wherein the first periodic section upper lasing state E2 is located near or above the highest point 3 of a first of the at least one step 47.

A second of the plurality of quantum wells 48 of the first periodic section n has a first periodic section n lower lasing state E1 and a first periodic section n lower state E0 formed therein, wherein the first periodic section n lower lasing state E1 is located below the first periodic section n upper lasing state E2 and below the highest point of the first of the at least one step 47, such that a spatial separation is such that the overlap of the wavefunctions of the second periodic section n+1 upper lasing state E2' and the first periodic section n lower state E0 is greater than the overlap between the wavefunctions of the second periodic section n+1 lower lasing state E1' and the first periodic section n lower state E0.

In some of these embodiments, the LO-phonon transition between the first periodic section n lower lasing state E1 and the first periodic section lower state E0 occurs primarily within second quantum well 48.

In these embodiments, the first step well 46 and the second quantum well 48 are separated by collector barrier 49. Collector barrier 49 affects spatial overlap of wavefunctions of E2 and E1; more particularly, in the illustrated embodiment, collector barrier 49 is adapted to create a diagonal radiative lasing (E2 to E1) transition, which reduces E2 to E0 scattering and, as temp increases, improves temperature performance. Note also that second periodic section n+1 collector barrier 49' spatially separates overlap of E2' and E1', which increases injection efficiency from first periodic section n lower lasing state E0 into second periodic section n+1 upper lasing state E2' by increasing spatial separation of wavefunctions of E0 and E1'. Note that the principal injection efficiency improving contribution is provided by step 47, which works to reduce spatial overlap of the wavefunctions of E0 and E1'.

In some of these embodiments, the radiative lasing transition between the first periodic section n upper lasing state E2 and the first periodic section n lower lasing state E1 is a photon-assisted tunneling transition through collector barrier 49.

Figure 5:
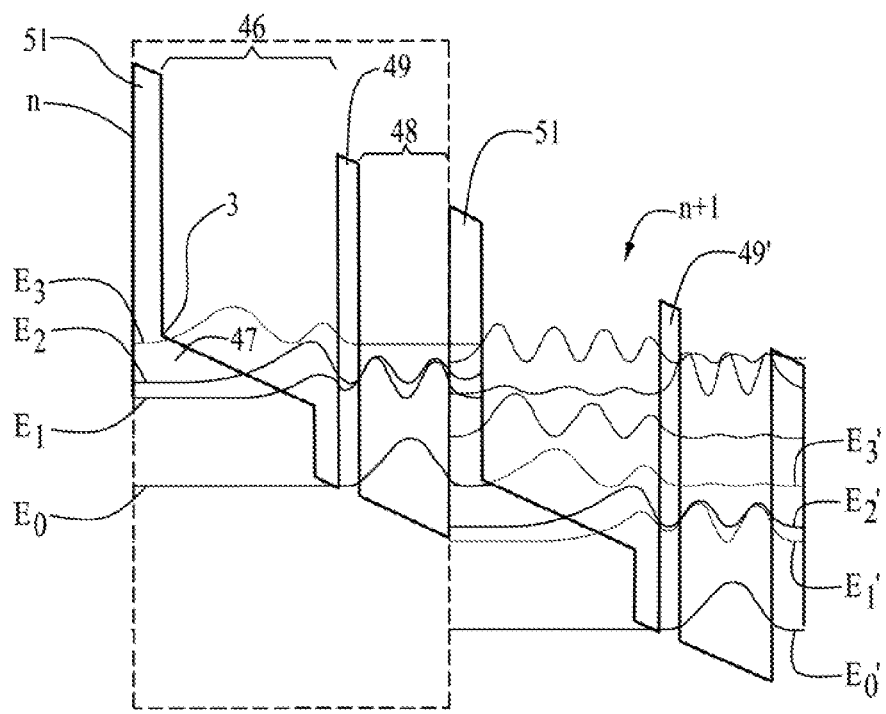
FIG. 5 illustrates the conduction band diagram of an embodiments (shown under an applied electric field) of a two well QC structure that includes a step well and a rectangular well per periodic section. Each energy state is characterized by a wavefunction whose modulus squared is indicative of the probability distribution of the electrons residing in that state.

With reference to FIG. 5, some embodiments include a semiconductor heterostructure having a plurality of periodic sections n, n+1 functionally associated in series. The plurality of periodic sections n, n+1 includes a first periodic section n and a second periodic section n+1, with the first periodic section n and second periodic section n+1 being adjacent. Each of the first periodic section n and the second periodic section n+1 have a plurality of quantum wells 46, 48, with at least one of the plurality of quantum wells 46, 48 being a step well 46.

In embodiments illustrated using FIG. 5, a lower (ground) state, a 'middle state' or 'lower lasing state', and an 'upper lasing state' are formed in each periodic section n, n+1 in the presence of an applied electric field. Note that FIG. 5 embodiments employ resonant tunneling of the lower lasing state E2; the use of resonant tunneling of the lower lasing state E2 in these embodiments means that the lower lasing state in these embodiments always has a doublet of states (for example, see quantum states $E_4$ and $E_3$ in FIG. 5 of U.S. Pat. No. 7,158,545 to Qing Hu, et al.). FIG. 5 embodiments use resonant tunneling and LO-phonon scattering for depopulation of lower lasing state E2.

First periodic section's n lower state, doublet lower lasing state, and upper lasing state, are designated as E0, E1 and E2, and E3, respectively. Second periodic section's n+1 lower state, doublet lower lasing state, and upper lasing state, are designated as E0', E1' and E2', and E3', respectively. The energy spacing between each periodic section's upper lasing state and doublet lower lasing state (which are spaced at the radiative energy spacing) is smaller than the energy spacing between the periodic section's doublet lower lasing state and lower state (which are spaced at or near the resonant LO-phonon energy spacing). Electrons populating a periodic section's doublet lower lasing state undergo non-radiative transition via resonant emission of a LO-phonon into the periodic section's lower state; the resonant LO-phonon emission selectively depopulates the periodic section's doublet lower lasing state such that the lifetime of the periodic section's upper lasing state is greater than the lifetime of the periodic section's doublet lower lasing state. In some of these embodiments, each periodic section's upper lasing state and lower lasing state are separated by an energy corresponding to an optical frequency in a range from about 1 terahertz to about 5 terahertz.

A first of the plurality of quantum wells 46 of the first periodic section n is a step well that has at least one step 47. The step well has, in the presence of an applied electric field, a first periodic section n upper lasing state E2 and a first periodic section n doublet lower lasing state E1, E2, wherein the first periodic section upper lasing state E3 is located near or above the highest point 3 of a first of the at least one step 47.

A second of the plurality of quantum wells 48 of the first periodic section n has a first periodic section n lower lasing state E1 and a first periodic section n lower state E0, wherein the first periodic section n doublet lower lasing state E1, E2 is located below the first periodic section n upper lasing state E3 and below the highest point of the first of the at least one step 47, such that a spatial separation is such that the overlap of the wavefunctions of the second periodic section n+1 upper lasing state E3' and the first periodic section n lower state E0 is greater than the overlap between the wavefunctions of the second periodic section n+1 doublet lower lasing state E1′, E2′ and the first periodic section n lower state E0.

In these embodiments, the first step well 46 and the second quantum well 48 are separated by a collector barrier 49. Collector barrier 49 affects spatial overlap of wavefunctions of E3 and E0; more particularly, collector barrier 49 is adapted to reduce scattering from upper lasing state E3 to lower state E0 by reducing the spatial overlap of the wavefunctions of E3 and E0.

Figure 7:
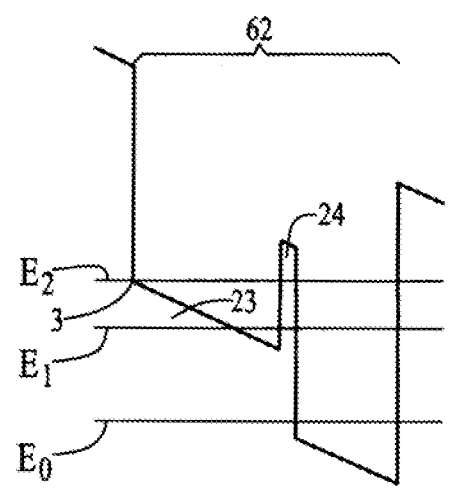
FIG. 7 illustrates an embodiment of a QC structure having two steps and a single quantum well per periodic section.

With reference to FIG. 7, note that some embodiments of a quantum cascade structure include a step well 62 having three states, ($E_0$ (lower state), $E_1$ ('middle state' or 'lower lasing state'), and $E_2$ ('upper lasing state')) formed in the presence of an applied electric field, wherein the energy spacing between $E_2$ and $E_1$ (which are spaced at the radiative energy spacing) is smaller than the energy spacing between $E_1$ and $E_0$ (which are spaced or gear the resonant LO-phonon energy spacing); the upper lasing state, $E_2$, is located near or above the highest point 3 of the first step 23, and the lower lasing state, $E_1$, is located below the upper lasing state, $E_2$, and below the highest point 3 of the step 23. In this embodiment, the second step 24 is adjacent to the first step 23 and there are two steps 23, 24 in the step well 62.

Figure 8:
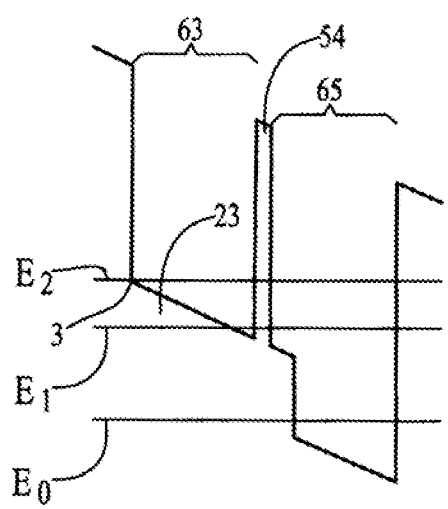
FIG. 8 illustrates an embodiment of a QC structure having one step, a collector barrier, and two wells (with one being a step well) per periodic section.

With reference to FIG. 8, note that some embodiments include a plurality of quantum wells 63, 65 in at least one lasing section the quantum cascade structure, with the plurality of quantum wells 63, 65 including at least one step well 65. This embodiment includes three energy states, ($E_0$ (lower state), $E_1$ ('lower lasing state'), and $E_2$ ('upper lasing state')) formed in the presence of an applied electric field; the energy spacing between $E_2$ and $E_1$ (which are spaced at the radiative energy spacing) is smaller than the energy spacing between $E_1$ and $E_0$ (which are spaced at or near the resonant LO-phonon energy spacing). Also, note that the upper lasing state, $E_2$, is located near or above the highest point 3 of the first step 23, and the lower lasing state, $E_1$, is located below the upper lasing state. $E_2$, and below the first step.

Figure 6:
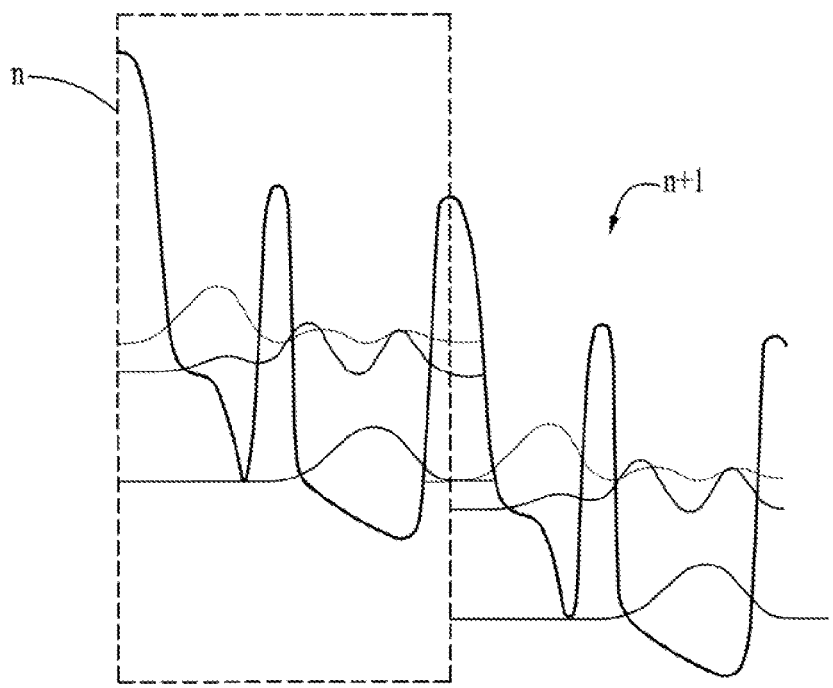
FIG. 6 shows the conduction band diagram of a tapered QC structure (shown under an applied electric field) that uses LO-phonon scattering for depopulation. The tapered structure differs significantly from previous structures in that potential profile is smoothly tapered. This provides the most general design approach to QC structures and can allows for more design freedom with controlling the energy states spacing and overlap of the wavefunctions. Each energy state is characterized by a wavefunction whose modulus squared is indicative of the probability distribution of the electrons residing in that state.

With reference to FIG. 6, in some embodiments, some steps and/or barriers are formed of multistep(s), which are defined as a plurality of contiguous monolayers having different bandgaps, resulting in conduction band profile that includes at least a portion of one section being tapered.

While the invention has been described, disclosed, illustrated and shown in various terms of certain embodiments or modifications, the scope of the invention is not intended to be nor should it be deemed to be, limited thereby and such other modifications or embodiments as may be suggested by the teachings herein are particularly reserved especially as they fall within the breadth and scope of the claims here appended.

What is claimed is:

1. A quantum cascade structure comprising:
a semiconductor heterostructure having a plurality of periodic sections functionally associated in series, said plurality of periodic sections including a first periodic section and a second periodic section, said first periodic section and said second periodic section being adjacent, each of said first periodic section and said second periodic section having at least one quantum well;
said second periodic section having a second periodic section upper lasing state, a second periodic section lower lasing state, and a second periodic section lower state;
at least one of said at least one quantum well of said first periodic section being a step well, said step well having a plurality of steps; and
said step well having, in the presence of an applied electric field, a first, periodic section upper lasing state, a first periodic section lower lasing state, and a first periodic section lower state, wherein said first periodic section upper lasing state is located near or above the highest point of a first of said plurality of steps, and said first periodic section lower lasing state is located below said first periodic section upper lasing state and below the highest point of said first of said plurality of steps, such that a spatial separation is such that the overlap of the wavefunctions of said second periodic section upper lasing state and said first periodic section lower state is greater than the overlap between the wavefunctions of said second periodic section lower lasing state and said first periodic section lower state.

2. The quantum cascade structure of claim 1 wherein the number of said plurality of steps is two.

3. The quantum cascade structure of claim 1 wherein the number of said plurality of steps is three.

4. The quantum cascade structure of claim 1, said step well further comprising a second step of said plurality of steps, wherein said first of said plurality of steps has a lower conduction band height than said second of said plurality of steps.

5. The quantum cascade structure of claim 1 wherein said first periodic section and said second periodic section consist of one of said at least one quantum well, said one of said at least one quantum well being a step well.

6. The quantum cascade structure of claim 3 wherein said first periodic section and said second periodic section consist of one of said at least one quantum well, said one of said at least one quantum well being a step well.

7. The quantum cascade structure of claim 4 wherein said first periodic section and said second periodic section consist of one of said at least one quantum well, said one of said at least one quantum well being a step well.

8. The quantum cascade structure of claim 1 wherein a radiative lasing transition between said first periodic section upper lasing state and said first periodic section lower lasing state occurs within said step well and is a photon-assisted tunneling transition through one of said plurality of steps.

9. The quantum cascade structure of claim 4 wherein a radiative lasing transition between said first periodic section upper lasing state and said first periodic section lower lasing state occurs within said step well and is a photon-assisted tunneling transition through said second of said plurality of steps.

10. The quantum cascade structure of claim 9 wherein a radiative lasing transition between said upper lasing state and said lower lasing state occurs within said step well and is a photon-assisted tunneling transition through a highest of said plurality of steps.

11. The quantum cascade structure of claim 10 wherein the number of said plurality of steps is at least three, wherein one of said second of said plurality of steps functions as a collector barrier, wherein said second of said plurality of steps is configured to spatially separate the wavefunction of said first periodic section upper lasing state and the wavefunction of said first periodic section lower lasing state.

12. The quantum cascade structure of claim 9, wherein said plurality of steps includes a last step spatially disposed after a second of said plurality of steps within said step well, wherein a radiative lacing transition between said upper lasing state and said lower lasing state occurs within said step well and is a photon-assisted tunneling transition through said second of said plurality of steps, wherein said last step is adapted to reduce scattering from said first periodic section upper lasing state to said first periodic section lower state, and wherein said radiative lasing transition primarily occurs spatially-before said last step.

13. A quantum cascade structure comprising:

a semiconductor heterostructure having a plurality of periodic sections functionally associated in series, said plurality of periodic sections including a first periodic section and a second periodic section, said first periodic section and said second periodic section being adjacent, said first periodic section having a first periodic section plurality of quantum wells and said second periodic section having a second periodic section plurality of quantum wells;

said second periodic section having a second periodic section upper lasing state, a second periodic section lower lasing state, and a second periodic section lower state;

a first of said first periodic section plurality of quantum wells being a first periodic section step well, said first periodic section step well having at least one step, said first periodic section step well having, in the presence of an applied electric field, a first periodic section upper lasing state, wherein said first periodic section upper lasing state is located near or above the highest point of a first of said at least one step; and a second of said periodic section plurality of quantum wells having a first periodic section lower lasing state and a first periodic section lower state, wherein said first periodic section lower lasing state is located below said first periodic section upper lasing state and below the highest point of said first of said at least one step, such that a spatial separation is such that the overlap of the wavefunctions of said second periodic section upper lasing state and said first periodic section lower state is greater than the overlap between the wavefunctions of said second periodic section lower lasing state and said first periodic section lower state.

14. The quantum cascade structure of claim 13 wherein said first periodic section step well and said second of said first periodic section plurality of quantum wells are separated by a collector barrier layer, and wherein a LO-phonon transition between said first periodic section lower lasing state and said first periodic section lower state occurs primarily within said second of said first periodic section plurality of quantum wells.

15. The quantum cascade structure of claim 13 wherein the radiative lasing transition between said first periodic section upper lasing state and said first periodic section lower lasing state is a photon-assisted tunneling transition through said collector barrier layer.

16. The quantum cascade structure of claim 14 wherein the LO-phonon transition between said first periodic section lower lasing state and said first periodic section lower state occurs primarily within said second quantum well.

* * * * *